US007748116B2

(12) United States Patent
Trezza

(10) Patent No.: US 7,748,116 B2
(45) Date of Patent: Jul. 6, 2010

(54) MOBILE BINDING IN AN ELECTRONIC CONNECTION

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 328 days.

(21) Appl. No.: 11/696,796

(22) Filed: Apr. 5, 2007

(65) Prior Publication Data
US 2008/0246145 A1 Oct. 9, 2008

(51) Int. Cl.
H01R 43/02 (2006.01)
(52) U.S. Cl. .............................. 29/878; 29/840; 29/854; 29/860; 29/876; 29/879; 228/193; 228/179.1
(58) Field of Classification Search .................. 29/876, 29/878, 879, 860, 840, 854; 228/179.1
See application file for complete search history.

(56) References Cited
U.S. PATENT DOCUMENTS

| 3,312,878 | A |   | 4/1967  | Poch et al.          |
|-----------|---|---|---------|----------------------|
| 4,418,857 | A |   | 12/1983 | Ainslie et al.       |
| 4,465,223 | A | * | 8/1984  | Cammarano et al. ........ 228/198 |
| 4,967,950 | A |   | 11/1990 | Legg et al.          |
| 5,100,480 | A |   | 3/1992  | Hayafuju             |
| 5,220,530 | A |   | 6/1993  | Itoh                 |
| 5,229,315 | A |   | 7/1993  | Jun et al.           |
| 5,308,784 | A |   | 5/1994  | Kim et al.           |
| 5,349,500 | A |   | 9/1994  | Casson et al.        |
| 5,399,898 | A | * | 3/1995  | Rostoker ..................... 257/499 |
| 5,563,084 | A |   | 10/1996 | Ramm et al.          |
| 5,587,119 | A |   | 12/1996 | White                |
| 5,608,264 | A |   | 3/1997  | Gaul                 |
| 5,708,569 | A |   | 1/1998  | Howard et al.        |
| 5,780,776 | A |   | 7/1998  | Noda                 |
| 5,814,889 | A |   | 9/1998  | Gaul                 |
| 5,872,338 | A |   | 2/1999  | Lan et al.           |
| 5,929,524 | A |   | 7/1999  | Drynan et al.        |
| 5,962,922 | A |   | 10/1999 | Wang                 |

(Continued)

FOREIGN PATENT DOCUMENTS

EP           0 516 866           12/1992

(Continued)

OTHER PUBLICATIONS

Office Action for U.S. Appl. No. 11/696,774 mailed Aug. 25, 2009.

(Continued)

Primary Examiner—Derris H Banks
Assistant Examiner—Azm Parvez

(57) ABSTRACT

A method of creating an electrical contact involves locating a barrier material at a location for an electrical connection, providing an electrically conductive bonding metal on the barrier material, the electrically conductive bonding metal having a diffusive mobile component, the volume of barrier material and volume of diffusive mobile component being selected such that the barrier material volume is at least 20% of the volume of the combination of the barrier material volume and diffusive mobile component volume. An electrical connection has an electrically conductive bonding metal between two contacts, a barrier material to at least one side of the electrically conductive bonding metal, and an alloy, located at an interface between the barrier material and the electrically conductive bonding metal. The alloy includes at least some of the barrier material, at least some of the bonding metal, and a mobile material.

19 Claims, 6 Drawing Sheets

U.S. PATENT DOCUMENTS

| | | | |
|---|---|---|---|
| 5,973,396 | A | 10/1999 | Farnworth |
| 6,037,665 | A | 3/2000 | Miyazaki |
| 6,075,710 | A | 6/2000 | Lau |
| 6,184,066 | B1 | 2/2001 | Chino et al. |
| 6,215,114 | B1 | 4/2001 | Yagi et al. |
| 6,314,013 | B1 | 11/2001 | Ahn et al. |
| 6,316,737 | B1 | 11/2001 | Evans et al. |
| 6,498,089 | B2 | 12/2002 | Komada |
| 6,559,540 | B2 | 5/2003 | Kawashima |
| 6,577,013 | B1 | 6/2003 | Glenn et al. |
| 6,590,278 | B1 | 7/2003 | Behun et al. |
| 6,599,778 | B2 | 7/2003 | Pogge et al. |
| 6,706,554 | B2 | 3/2004 | Ogura |
| 6,740,576 | B1 | 5/2004 | Lin et al. |
| 6,770,822 | B2 | 8/2004 | Pasternak et al. |
| 6,939,789 | B2 | 9/2005 | Huang et al. |
| 7,157,310 | B2 | 1/2007 | Benson et al. |
| 7,400,042 | B2 * | 7/2008 | Eriksen et al. .............. 257/757 |
| 2001/0001292 | A1 | 5/2001 | Bertin et al. |
| 2001/0033509 | A1 | 10/2001 | Ahn et al. |
| 2001/0048166 | A1 | 12/2001 | Miyazaki |
| 2002/0017399 | A1 | 2/2002 | Chang et al. |
| 2002/0027441 | A1 | 3/2002 | Akram et al. |
| 2002/0053726 | A1 | 5/2002 | Mikubo et al. |
| 2002/0094675 | A1 | 7/2002 | Kerr et al. |
| 2002/0102835 | A1 | 8/2002 | Stucchi et al. |
| 2002/0127761 | A1 | 9/2002 | Mottura et al. |
| 2002/0134581 | A1 | 9/2002 | Figuero et al. |
| 2003/0047799 | A1 | 3/2003 | Cheever et al. |
| 2003/0052324 | A1 | 3/2003 | Kimura |
| 2003/0080408 | A1 | 5/2003 | Farnworth et al. |
| 2003/0085471 | A1 | 5/2003 | Iijima et al. |
| 2003/0159262 | A1 | 8/2003 | Pasternak et al. |
| 2003/0206680 | A1 | 11/2003 | Bakir et al. |
| 2004/0051168 | A1 | 3/2004 | Arai et al. |
| 2004/0124523 | A1 | 7/2004 | Poo et al. |
| 2004/0207061 | A1 | 10/2004 | Farrar et al. |
| 2004/0256686 | A1 | 12/2004 | Sassolini et al. |
| 2004/0262635 | A1 | 12/2004 | Lee |
| 2005/0006789 | A1 | 1/2005 | Tomono et al. |
| 2005/0046034 | A1 | 3/2005 | Farrar |
| 2005/0104027 | A1 | 5/2005 | Lazarev |
| 2005/0104219 | A1 | 5/2005 | Matsui |
| 2005/0121768 | A1 | 6/2005 | Edelstein et al. |
| 2005/0133930 | A1 | 6/2005 | Savastisuk et al. |
| 2005/0146049 | A1 | 7/2005 | Kripesh et al. |
| 2006/0134832 | A1 | 6/2006 | Iwasaki et al. |
| 2006/0278992 | A1 | 12/2006 | Trezza et al. |

FOREIGN PATENT DOCUMENTS

| | | |
|---|---|---|
| EP | 0 757 386 | 2/1997 |
| EP | 1 415 950 | 5/2004 |
| WO | WO 2006/074165 | 7/2006 |
| WO | WO 2006/138492 | 12/2006 |

OTHER PUBLICATIONS

International Search Report and Written Opinion mailed on Dec. 12, 2008 in PCT/IB2008/001436.

Jong-Hwan Park et al.; "Reaction Characteristices of the Au-Sn Solder with Under-Bump Metallurgy Layers in Optoelectronic Packages"; Journal of Electronic Materials, vol. 31, No. 11, 2002, pp. 1175-1180.

J.Y. Tsai et al.; "Controlling microstructures from the Gold-Tin Reaction"; Journal of Electronic Materials; vol. 34., No. 2, 2005, pp. 182-187.

H.G. Song et al; "The Microstructure of Eutectic Au-Sn Solder Bumps on Cu/Electroless Ni/Au"; Journal of Electronic Materials, vol. 30, No. 9, 2001.

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.

International Search Report for PCT/US06/23361, dated Sep. 19, 2007.

International Search Report for PCT/US06/23364, dated Nov. 13, 2006.

International Search Report for PCT/US06/23366, dated Dec. 8, 2006.

International Search Report for PCT/US06/23297, dated Jan. 3, 2007.

International Search Report for PCT/US06/23249, dated Jun. 11, 2007.

Communication Relating to the Results of a Partial International Search for PCT/IB08/001444, dated Dec. 17, 2008.

International Search Report and Written Opinion for PCT/IB08/001444, dated Mar. 23, 2009.

Final Office Action mailed Mar. 31, 2009 in U.S. Appl. No. 11/696,774 (which should be on record with the USPTO).

International Preliminary Report on Patentability for PCT/IB2008/001436 mailed Oct. 15, 2009.

International Preliminary Report on Patentability for PCT/IB2008/001444 mailed Oct. 15, 2009.

International Search Report, PCT/US06/23361, dated Sep. 19, 2007.

Final Office Action for U.S. Appl. No. 11/696,774 mailed Feb. 5, 2010.

* cited by examiner

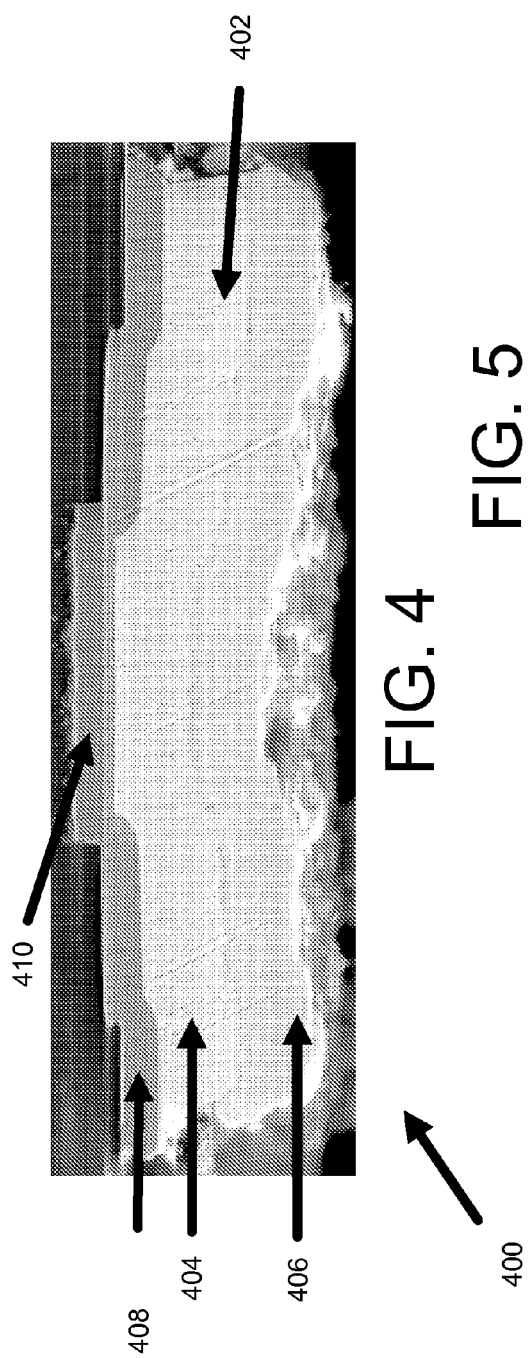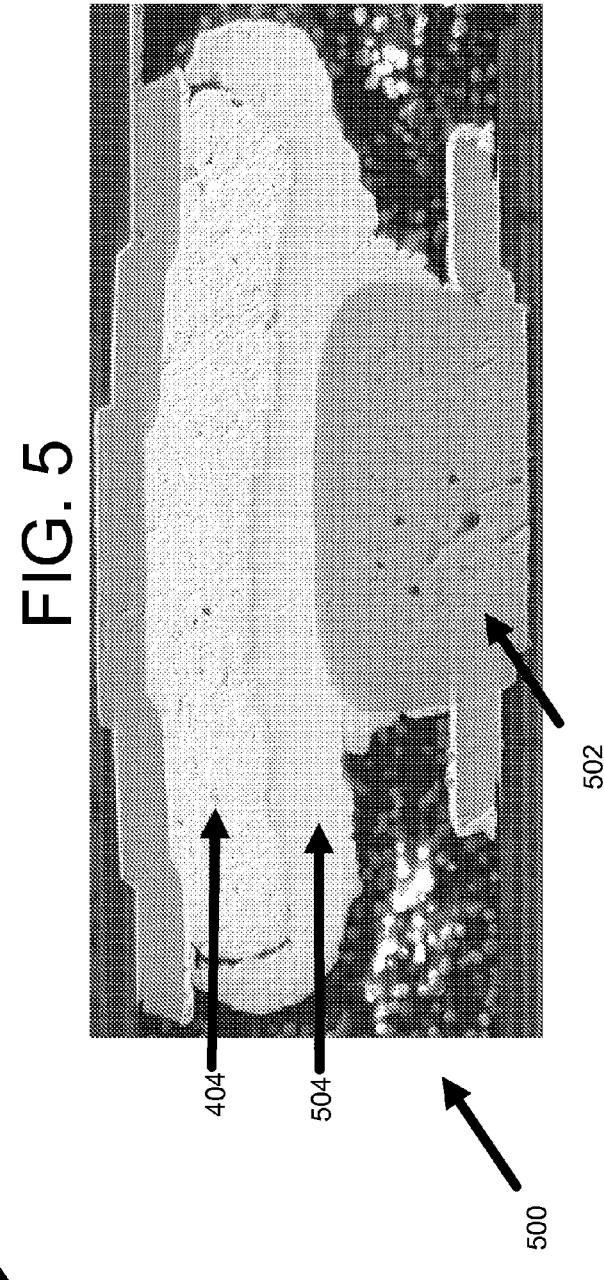

MOBILE BINDING IN AN ELECTRONIC CONNECTION

FIELD OF THE INVENTION

The present invention relates to semiconductors and, more particularly, to electrical connections for such devices.

CROSS REFERENCE TO RELATED APPLICATIONS

This application is related to a U.S. patent application Ser. No. 11/696,774 entitled "Heat Cycle-Able Connection" filed concurrently herewith, the entirety of which is incorporated by reference as if fully set forth herein.

BACKGROUND

A typical solder ball used in flip-chip die attachment is made from 63% Lead-37% Tin. Just after reflow, which is the final step in the traditional solder ball formation process and occurs prior to attachment, the solder material is uniform in composition and consistency. FIG. 1 is an enlarged photograph of a cross section of a typical solder ball 100 just after reflow. Within this solder material, there are highly mobile tin ions. As a result, over time, these tin ions will migrate within the solder. Even at moderate temperature, the migrating ions will tend to clump together causing the lead and tin to undergo a phase segregation process. FIG. 2 is an enlarged photograph of a cross section of a typical solder 200 ball after 1000 hours at a temperature of 150° C. (which is within the operating temperature of some chips). As is evident in FIG. 2, there is significant phase segregation with the tin forming the lighter colored clumps 202 in FIG. 2. As this phase segregation occurs, the solder ball becomes more brittle and its reliability is reduced. Similar phase segregation can also occur due to electromigration of mobile atoms. FIG. 3 is an enlarged photograph of a cross section of a typical solder bump 300 where the phase segregation 302 has occurred due to electromigration of mobile atoms. As with FIG. 2, the result is a brittle solder bump and reduced reliability. In both cases, when a connection involves a solder bump that has undergone phase segregation lifetime of the connection is reduced.

In addition to decreasing lifetime, phase segregation reduces the current carrying capacity of a solder bump. This is because diffusion of atoms can leave voids 304 which do not carry current and, moreover, as process continues and the connection undergoes the heating and cooling cycles attendant with usage, the voids 304 grow and ultimately can become a source of contact failure.

One approach that does not result in phase segregation is to use a single, non-reactive metal like gold to form the connection. While this approach avoids the problem, it significantly increases the cost of each connection which is unsatisfactory for commercial applications where cost competitiveness is an issue.

Thus, there is a need in the art of electronic connections for a contact approach that does not have the phase segregation problem present in the prior art such as discussed above.

Moreover, there is a need for an approach that can accomplish the above in a cost competitive manner.

SUMMARY OF THE INVENTION

We have devised a connection that allows for the use of solder or some other metal alloy that would normally be subject to phase segregation problems to form a connection while substantially reducing, if not eliminating, the phase segregation problem.

One aspect of our approach involves a method of creating an electrical contact. The method involves locating a barrier material at a location for an electrical connection, providing an electrically conductive bonding metal on the barrier material, with the electrically conductive bonding metal having a diffusive mobile component, the volume of barrier material and volume of diffusive mobile component being selected such that the barrier material volume is at least 20% of the volume of the combination of the barrier material volume and diffusive mobile component volume.

Another aspect involves an electrical connection. The electrical connection has an electrically conductive bonding metal between two contacts, a barrier material to at least one side of the electrically conductive bonding metal, and an alloy, located at an interface between the barrier material and the electrically conductive bonding metal. The alloy includes at least some of the barrier material, at least some of the bonding metal, and a mobile material.

A further aspect involves an apparatus. The apparatus includes a connection between two electrical contacts, the connection including a bonding metal, a barrier material and an alloy, the alloy having a mobile constituent component capable of phase segregation over time, which after being maintained at a temperature of 200° C. for 1000 hours, has undergone substantially no phase segregation.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIG. 4 is a photograph of a cross section of an example malleable contact;

FIG. 5 is a photograph of a cross section of a rigid contact and malleable contact after a tack cycle process has been completed;

DETAILED DESCRIPTION

Figure 1:
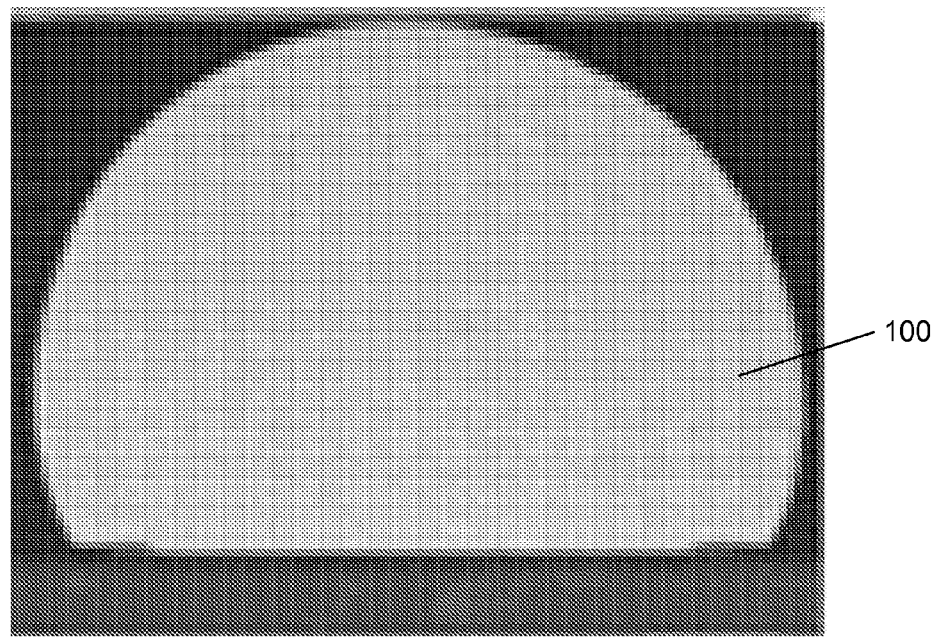
FIG. 1 is a photograph of a cross section of a typical solder ball just after reflow.
Figure 2:
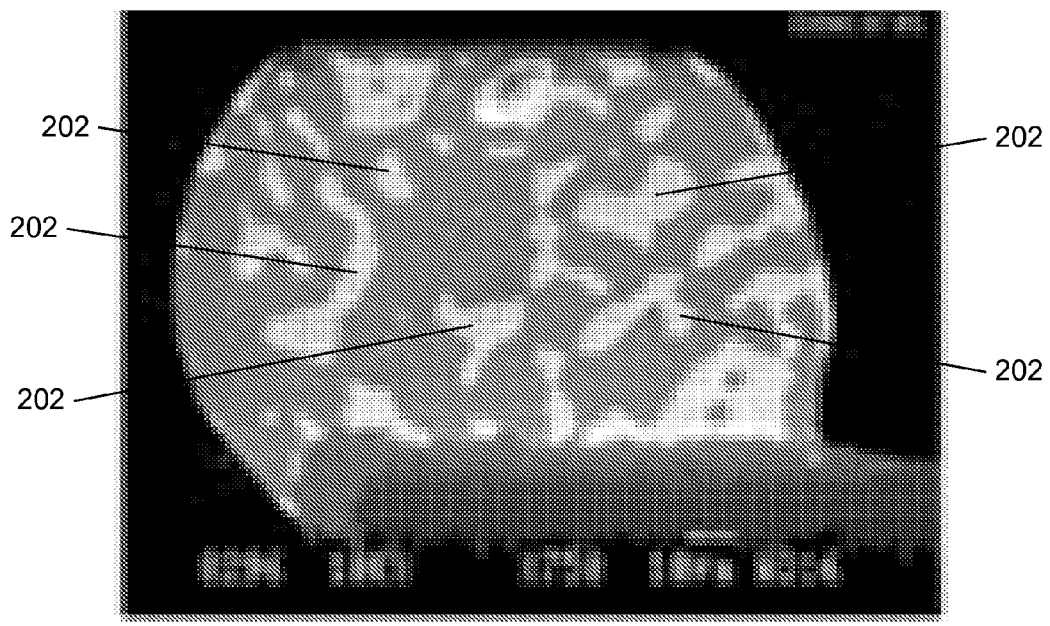
FIG. 2 is a photograph of a cross section of a typical solder ball after 1000 hours at a temperature of 150° C.
Figure 3:
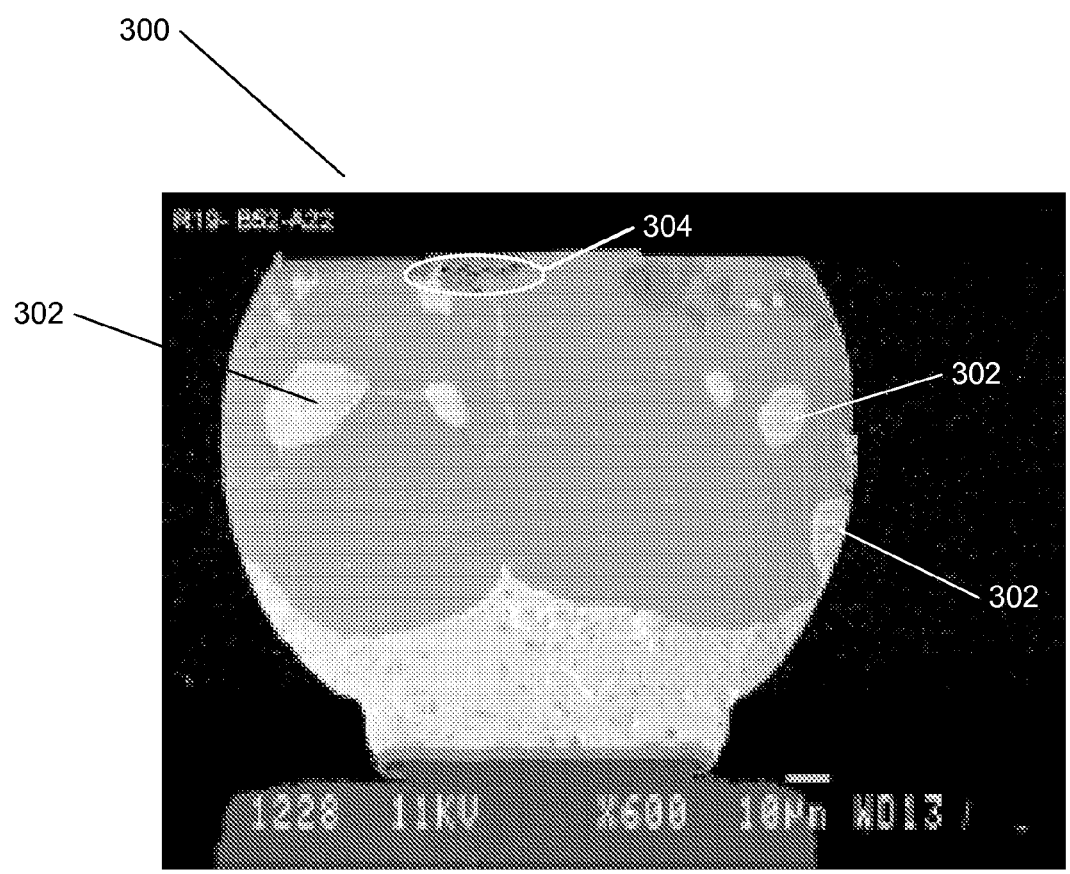
FIG. 3 is a photograph of a cross section of a typical solder bump where the phase segregation has occurred due to electromigration of mobile atoms.

This application is related to a U.S. Patent Application entitled "Heat Cycle-able Connection" filed concurrently herewith, the entirety of which is incorporated herein by reference as if fully set forth herein.

U.S. patent application Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, incorporated herein by reference describe various techniques for forming small, deep vias in, and electrical contacts for, semiconductor wafers. Our techniques allow for via densities and placement that was previously unachievable and can be performed on a chip, die or wafer scale. In conjunction with those approaches, due to the number and density of potential connections, it is desirable to substantially reduce or eliminate the possibility of phase segregation and do so in a cost effective manner while still allowing use of a solder or alloy to form the desired connections.

Our approach involves two aspects which each can be used alone or in combination with each other.

The first aspect involves use of a material, called a barrier, under the bonding metal, such as a solder or alloy, to bind up and/or attract mobile atoms in the bonding metal. This is done by selecting a suitable material and by making sure that the contact area and thickness (i.e. volume) of the barrier material is large relative to the volume of the solder or connection forming alloy (generically referred to hereafter as the "bonding metal"), which, in the case of a post and penetration connection such as described in the above-incorporated applications, would be the malleable material. In an alternative embodiment, at least a portion of the mobile atoms are part of a contact from which an electrical connection is formed.

Alternatively, to the extent the volume of the most mobile element of the bonding metal can be estimated or determined, our approach is to only require the volume of barrier material to be large relative to the volume of that most mobile component in the bonding metal instead of the entirely of the bonding metal.

In either case, it is desired that the volume of barrier material be at least about 20% of the total volume or alternatively at least 20% of the volume of the most mobile component, and preferably a greater percentage. Note that the 20% number is not a hard and fast limit, but rather what is expected to be needed to ensure binding of most of the mobile atoms. It may be the case that certain combinations of bonding metal and barrier can have a lesser limit.

By way of one representative example, presume that a barrier is used on each of the two mating contacts and there is a constant surface area of contact, then the height can be a surrogate for volume. If the total thickness of the bonding metal is about 15 µm or less, then 20% of that would be about 3 µm and the barrier material on each should be about 1.5 µm thick.

In another representative example, involving a barrier on each of the two mating connections and where the bonding metal is a malleable material as such as described in the above-incorporated applications, if the barrier on each side of the malleable material will have a thickness of at least about 1.5 µm, and preferably about 2 µm to 3 µm, the total height of the barrier material, because there are two barriers (one on each side), would be between about 3 µm and about 6 µm. As a result, using the 20% measure, the total thickness of the malleable material should less than 15 µm and, in this scenario, preferably about 9 µm or less. In such a case, the percentage of barrier to total volume would range from about 20% at the minimum (3 µm/15 µm) to about 67% if the barriers were 3 µm on a side and the malleable material thickness was 9 µm (i.e., 6 µm/9 µm).

Of course, as noted above depending upon the particular materials used for the barrier and bonding metal, the minimum ratio might be slightly but not appreciably lower provided that the above criteria was met. Preferably, however, higher ratios will be used because the larger volume barrier would only be better at attracting and binding.

We have specifically found this to be the case, for example, when we use a gold-tin alloy of Au75%/Sn25% to Au85%/Sn15% as the bonding metal and nickel as the barrier. Thus, it will be appreciated that higher percentages are better because they will likely yield better results in many implementations.

The use of a large volume of barrier material causes the barrier to attract and trap or soak up the mobile atoms in the bonding metal in an orderly manner thereby substantially reducing, if not completely preventing, the phase segregation problem. Moreover, the typical about 20% minimum ensures that the barrier will not approach "saturation" or, in the case where the barrier is over a contact pad, be 'broken through' during the process of absorbing the material. In general, the reason for not typically using barriers of less than about 20%, is that, at lower percentages, the smaller volume of barrier could not attract, trap or bind the volume of mobile material. Thus, the non-attracted, trapped or bound, mobile material would be free to migrate and clump together thereby causing the phase segregation problems in the prior art, albeit to a potentially lesser degree.

The second aspect involves ensuring that the distance between barrier and mobile atoms in the bonding metal is kept short. In practical terms, since the width or diameter of the contact will be small, the height will be the greatest determiner of distance. As such, the height of the bonding metal should be small in absolute terms. By keeping the height of the bonding metal below about 20 to 25 µm, and preferably even below about 15 µm, with the typical expected height being from about 9 µm to about 6 µm, the distance that the mobile material has to travel will be short so that the likelihood of the mobile material encountering the barrier will be greater. For example, if suitable barriers are used on both sides of a connection, the mobile atoms that are farthest from any barrier in a 25 µm tall bump need only travel half that distance to reach the barrier, i.e. only 12.5 µm. Thus, by keeping the overall height small, the tendency is for mobile atoms to reach, and the barrier to rapidly absorb, the mobile atoms during the heating part of the connection phase, be it soldering or the tack or fuse phases of a tack & fuse process such as described in the above-incorporated applications, rather than leaving that mobile material free to move about the bonding metal after joining.

It should now be understood and appreciated that, due to the nature of the post and penetration connection approach, the above is particularly suitable for use with that connection process (as noted above) by placing a sufficient amount of the barrier material under the malleable material. Moreover, the approach is enhanced if the post is also coated with sufficient barrier material because, when the post penetrates into the malleable material, the distance the ions have to travel to reach barrier material is reduced.

In general, when using the approach described herein, suitable barrier materials can include nickel (Ni), chromium, (Cr) titanium (Ti), platinum (Pt), palladium (Pd), Tantalum (Ta), tungsten (W), as well as alloys thereof or layered combinations thereof. More specifically, a suitable barrier will be those metals or alloys that will bind up with a component of the binding metal that has a lower melting point than the highest melting point component. For example, if the bonding metal is an alloy of Ga—In—Sn—Zn, a barrier that would remove Zn from the alloy and/or Sn from the alloy would raise the melting point and achieve the goal herein for some implementations.

Alternatively, suitable materials that can be used with or as a barrier (also called a cap) to add a component an raise the melting point are those materials that have a higher melting point than the lowest melting point component of the bonding metal and can alloy with the bonding metal.

In general, as illustrated herein, review of the phase diagram for particular alloys of interest will facilitate selection of the appropriate bonding metal.

Table 1 below, identifies some of the numerous materials that can be used as bonding metals and provides a way to essentially identify the changed melting point without resort to reference phase diagrams.

Table 1 contains, the approximate melting temperature in the first column, the approximate solidification temperature in the second column, and the particular suitable bonding metal in the third row.

TABLE 1

| Melting Temperature | Solidification Temperature | Bonding Metal |
|---|---|---|
| 8° C. | 7° C. | 61% Ga/25% In/13% Sn/1% Zn |
| 11° C. | 11° C. | 62.5% Ga/21.5% In/16% Sn |
| 16° C. | 16° C. | 75.5% Ga/24.5% In |
| 25° C. | 16° C. | 95% Ga/5% In |
| 30° C. | 30° C. | 100% Ga |
| 43° C. | 38° C. | 42.9% Bi/21.7% Pb/18.3% In/8% Sn/5.1% Cd/4% Hg |
| 47° C. | 47° C. | 44.7% Bi/22.6% Pb/19.1% In/8.3% Sn/5.3% Cd |
| 52° C. | 47° C. | 44.7% Bi/22.6% Pb/16.1% In/11.3% Sn/5.3% Cd |
| 56° C. | 54° C. | 49.1% Bi/20.9% In/17.9% Pb/11.6% Sn/0.5% Cd |
| 58° C. | 58° C. | 49% Bi/21% In/18% Pb/12% Sn |
| 60° C. | 60° C. | 51% In/32.5% Bi/16.5% Sn |
| 62° C. | 62° C. | 61.7% In/30.8% Bi/7.5% Cd |
| 65° C. | 57° C. | 47.5% Bi/25.4% Pb/12.6% Sn/9.5% Cd/5% In |
| 65° C. | 61° C. | 48% Bi/25.6% Pb/12.8% Sn/9.6% Cd/4% In |
| 69° C. | 58° C. | 49% Bi/18% Pb/18% In/15% Sn |
| 70° C. | 70° C. | 50% Bi/26.7% Pb/13.3% Sn/10% Cd |
| 72° C. | 72° C. | 66.3% In/33.7% Bi |
| 73° C. | 70° C. | 50.5% Bi/27.8% Pb/12.4% Sn/9.3% Cd |
| 73° C. | 70° C. | 50% Bi/25% Pb/12.5% Sn/12.5% Cd |
| 73° C. | 70° C. | 50% Bi/25% Pb/12.5% Sn/12.5% Cd |
| 78° C. | 78° C. | 48.5% Bi/41.5% In/10% Cd |
| 78° C. | 70° C. | 50% Bi/34.5% Pb/9.3% Sn/6.2% Cd |
| 79° C. | 79° C. | 57% Bi/26% In/17% Sn |
| 81° C. | 81° C. | 54% In/29.7% Bi/16.3% Sn |
| 82° C. | 77° C. | 50% Bi/39% Pb/8% Cd/3% Sn |
| 85° C. | 81° C. | 50.3% Bi/39.2% Pb/8% Cd/1.5% In/1% Sn |
| 88° C. | 71° C. | 42.5% Bi/37.7% Pb/11.3% Sn/8.5% Cd |
| 89° C. | 80° C. | 50.3% Bi/39.2% Pb/8% Cd/1.5% Sn/1% In |
| 89° C. | 80° C. | 50.9% Bi/31.1% Pb/15% Sn/2% In/1% Cd |
| 91° C. | 87° C. | 51.1% Bi/39.8% Pb/8.1% Cd/1% In |
| 92° C. | 83° C. | 52% Bi/31.7% Pb/15.3% Sn/1% Cd |
| 92° C. | 92° C. | 51.6% Bi/40.2% Pb/8.2% Cd |
| 93° C. | 73° C. | 50% Bi/39% Pb/7% Cd/4% Sn |
| 93° C. | 87° C. | 51.4% Bi/31.4% Pb/15.2% Sn/2% In |
| 93° C. | 93° C. | 44% In/42% Sn/14% Cd |
| 94° C. | 90° C. | 52% Bi/31.7% Pb/15.3% Sn/1% In |
| 95° C. | 95° C. | 52.5% Bi/32% Pb/15.5% Sn |
| 96° C. | 95° C. | 52% Bi/32% Pb/16% Sn |
| 96° C. | 96° C. | 52% Bi/30% Pb/18% Sn |
| 96° C. | 96° C. | 46% Bi/34% Sn/20% Pb |
| 99° C. | 93° C. | 50% Bi/31% Pb/19% Sn |
| 100° C. | 100° C. | 50% Bi/28% Pb/22% Sn |
| 102° C. | 70° C. | 40.5% Bi/27.8% Pb/22.4% Sn/9.3% Cd |
| 103° C. | 102° C. | 54% Bi/26% Sn/20% Cd |
| 104° C. | 95° C. | 56% Bi/22% Pb/22% Sn |
| 104° C. | 95° C. | 50% Bi/30% Pb/20% Sn |
| 105° C. | 70° C. | 35.3% Bi/35.1% Pb/20.1% Sn/9.5% Cd |
| 105° C. | 98° C. | 52.2% Bi/37.8% Pb/10% Sn |
| 107° C. | 96° C. | 45% Bi/35% Pb/20% Sn |
| 108° C. | 95° C. | 46% Bi/34% Pb/20% Sn |
| 108° C. | 102° C. | 54.5% Bi/39.5% Pb/6% Sn |
| 108° C. | 108° C. | 52.2% In/46% Sn/1.8% Zn |
| 109° C. | 109° C. | 67% Bi/33% In |
| 112° C. | 98° C. | 51.6% Bi/41.4% Pb/7% Sn |
| 113° C. | 72° C. | 40% Bi/33.4% Pb/13.3% Sn/13.3% Cd |
| 113° C. | 104° C. | 54.4% Bi/43.6% Pb/1% Sn/1% Cd |
| 115° C. | 95° C. | 50% Bi/25% Pb/25% Sn |
| 117° C. | 103° C. | 53% Bi/42.5% Pb/4.5% Sn |
| 118° C. | 75° C. | 38.2% Bi/31.7% Sn/26.4% Pb/2.6% Cd/1.1% Sb |
| 118° C. | 118° C. | 52% In/48% Sn |
| 119° C. | 108° C. | 53.7% Bi/43.1% Pb/3.2% Sn |
| 120° C. | 117° C. | 55% Bi/44% Pb/1% Sn |
| 121° C. | 92° C. | 56.8% Bi/41.2% Pb/2% Cd |
| 121° C. | 120° C. | 55% Bi/44% Pb/1% In |
| 123° C. | 70° C. | 46% Pb/30.7% Bi/18.2% Sn/5.1% Cd |
| 123° C. | 123° C. | 74% In/26% Cd |
| 124° C. | 124° C. | 55.5% Bi/44.5% Pb |
| 125° C. | 118° C. | 50% In/50% Sn// |
| 125° C. | 125° C. | 70% In/15% Sn/9.6% Pb/5.4% Cd |
| 126° C. | 124° C. | 58% Bi/42% Pb |
| 127° C. | 93° C. | 38% Pb/37% Bi/25% Sn |
| 129° C. | 95° C. | 51.6% Bi/37.4% Sn/6% In/5% Pb |
| 130° C. | 121° C. | 40% In/40% Sn/20% Pb |
| 131° C. | 118° C. | 52% Sn/48% In |
| 133° C. | 96° C. | 34% Pb/34% Sn/32% Bi |
| 133° C. | 128° C. | 56.8% Bi/41.2% Sn/2% Pb |
| 135° C. | 96° C. | 38.4% Pb/30.8% Bi/30.8% Sn |
| 135° C. | 135° C. | 57.4% Bi/41.6% Sn/1% Pb |
| 136° C. | 95° C. | 36% Bi/32% Pb/31% Sn/1% Ag |
| 136° C. | 95° C. | 36.7% Bi/31.8% Pb/31.5% Sn |
| 136° C. | 121° C. | 55.1% Bi/39.9% Sn/5% Pb |
| 137° C. | 95° C. | 36.4% Bi/31.8% Pb/31.8% Sn |
| 137° C. | 96° C. | 43% Pb/28.5% Bi/28.5% Sn |
| 138° C. | 138° C. | 58% Bi/42% Sn |
| 139° C. | 96° C. | 38.4% Pb/30.8% Bi/30.8% Sn |
| 139° C. | 132° C. | 45% Sn/32% Pb/18% Cd/5% Bi |
| 140° C. | 139° C. | 57% Bi/42% Sn/1% Ag |
| 143° C. | 96° C. | 33.4% Bi/33.3% Pb/33.3% Sn |
| 143° C. | 143° C. | 97% In/3% Ag |
| 144° C. | 144° C. | 60% Bi/40% Cd |
| 145° C. | 118° C. | 58% Sn/42% In |
| 145° C. | 145° C. | 51.2% Sn/30.6% Pb/18.2% Cd |
| 150° C. | 125° C. | 95% In/5% Bi |
| 150° C. | 150° C. | 99.3% In/0.7% Ga |
| 151° C. | 143° C. | 90% In/10% Sn |
| 152° C. | 120° C. | 42% Pb/37% Sn/21% Bi |
| 152° C. | 140° C. | 54% Sn/26% Pb/20% In |
| 152° C. | 152° C. | 99.4% In/0.6% Ga |
| 153° C. | 153° C. | 99.6% In/0.4% Ga |
| 154° C. | 149° C. | 80% In/15% Pb/5% Ag |
| 160° C. | 122° C. | 54.5% Pb/45.5% Bi |
| 160° C. | 145° C. | 50% Sn/25% Cd/25% Pb |
| 162° C. | 140° C. | 48% Sn/36% Pb/16% Bi |
| 163° C. | 144° C. | 43% Sn/43% Pb/14% Bi |
| 167° C. | 120° C. | 50% Sn/40% Pb/10% Bi |
| 167° C. | 154° C. | 70% Sn/18% Pb/12% In |
| 170° C. | 131° C. | 51.5% Pb/27% Sn/21.5% Bi |
| 170° C. | 138° C. | 60% Sn/40% Bi |
| 172° C. | 166° C. | 49.7% Sn/41.8% Pb/8% Bi/0.5% Ag |
| 173° C. | 130° C. | 50% Pb/30% Sn/20% Bi |
| 173° C. | 160° C. | 46% Sn/46% Pb/8% Bi |
| 175° C. | 165° C. | 70% In/30% Pb |
| 176° C. | 146° C. | 47.5% Pb/39.9% Sn/12.6% Bi |
| 177° C. | 177° C. | 67.8% Sn/32.2% Cd |
| 179° C. | 179° C. | 62.5% Sn/36.1% Pb/1.4% Ag |

TABLE 1-continued

| Melting Temperature | Solidification Temperature | Bonding Metal |
|---|---|---|
| 180° C. | 96° C. | 60% Sn/25.5% Bi/14.5% Pb |
| 181° C. | 134° C. | 37.5% Pb/37.5% Sn/25% In |
| 181° C. | 173° C. | 60% In/40% Pb |
| 182° C. | 178° C. | 62.6% Sn/37% Pb/0.4% Ag |
| 183° C. | 183° C. | 63% Sn/37% Pb |
| 183° C. | 183° C. | 62% Sn/38% Pb |
| 184° C. | 183° C. | 65% Sn/35% Pb |
| 186° C. | 174° C. | 86.5% Sn/5.5% Zn/4.5% In/3.5% Bi |
| 186° C. | 183° C. | 70% Sn/30% Pb |
| 187° C. | 175° C. | 77.2% Sn/20% In/2.8% Ag |
| 187° C. | 181° C. | 83.6% Sn/8.8% In/7.6% Zn |
| 189° C. | 179° C. | 61.5% Sn/35.5% Pb/3% Ag |
| 191° C. | 183° C. | 60% Sn/40% Pb |
| 192° C. | 183° C. | 75% Sn/25% Pb |
| 195° C. | 165° C. | 58% In/39% Pb/3% Ag |
| 197° C. | 170° C. | 55.5% Pb/40.5% Sn/4% Bi |
| 199° C. | 183° C. | 80% Sn/20% Pb |
| 199° C. | 199° C. | 91% Sn/9% Zn |
| 200° C. | 183° C. | 55% Sn/45% Pb |
| 205° C. | 183° C. | 85% In/15% Pb |
| 205° C. | 204° C. | 86.9% Sn/10% In/3.1% Ag |
| 210° C. | 177° C. | 55% Pb/44% Sn/1% Ag |
| 210° C. | 184° C. | 50% In/50% Pb |
| 212° C. | 183° C. | 50% Sn/50% Pb |
| 213° C. | 183° C. | 90% Sn/10% Pb |
| 213° C. | 211° C. | 91.8% Sn/4.8% Bi/3.4% Ag |
| 216° C. | 183° C. | 50% Sn/49.5% Pb/0.5% Sb |
| 217° C. | 217° C. | 90% Sn/10% Au |
| 218° C. | 183° C. | 52% Pb/48% Sn |
| 220° C. | 217° C. | 95.5% Sn/3.8% Ag/0.7% Cu |
| 220° C. | 217° C. | 95.5% Sn/3.9% Ag/0.6% Cu |
| 220° C. | 217° C. | 96.5% Sn/3% Ag/0.5% Cu |
| 221° C. | 221° C. | 96.5% Sn/3.5% Ag |
| 222° C. | 183° C. | 95% Sn/5% Pb |
| 225° C. | 217° C. | 95.5% Sn/4% Ag/0.5% Cu |
| 225° C. | 217° C. | 96.2% Sn/2.5% Ag/0.8% Cu/0.5% Sb |
| 226° C. | 221° C. | 97.5% Sn/2.5% Ag |
| 227° C. | 103° C. | 48% Bi/28.5% Pb/14.5% Sn/9% Sb |
| 227° C. | 183° C. | 55% Pb/45% Sn |
| 227° C. | 215° C. | 98.5% Sn/1% Ag/0.5% Cu |
| 227° C. | 227° C. | 99% Sn/1% Cu |
| 227° C. | 227° C. | 99.3% Sn/0.7% Cu |
| 231° C. | 185° C. | 58% Pb/40% Sn/2% Sb |
| 231° C. | 197° C. | 60% Pb/40% In |
| 232° C. | 179° C. | 60% Pb/37% Sn/3% Ag |
| 232° C. | 232° C. | 100% Sn |
| 233° C. | 233° C. | 65% Sn/25% Ag/10% Sb |
| 235° C. | 235° C. | 99% Sn/1% Sb |
| 237° C. | 143° C. | 90% In/10% Ag |
| 238° C. | 183° C. | 60% Pb/40% Sn |
| 238° C. | 232° C. | 97% Sn/3% Sb |
| 240° C. | 221° C. | 95% Sn/5% Ag |
| 240° C. | 235° C. | 95% Sn/5% Sb |
| 243° C. | 185° C. | 63.2% Pb/35% Sn/1.8% Sb |
| 247° C. | 183° C. | 65% Pb/35% Sn |
| 247° C. | 237° C. | 83% Pb/10% Sb/5% Sn/2% Ag |
| 250° C. | 185° C. | 68.4% Pb/30% Sn/1.6% Sb |
| 251° C. | 134° C. | 95% Bi/5% Sn |
| 253° C. | 179° C. | 70% Pb/27% Sn/3% Ag |
| 255° C. | 245° C. | 85% Pb/10% Sb/5% Sn |
| 257° C. | 183° C. | 70% Pb/30% Sn |
| 260° C. | 179° C. | 50% Sn/47% Pb/3% Ag |
| 260° C. | 240° C. | 75% Pb/25% In |
| 260° C. | 252° C. | 90% Pb/10% Sb |
| 263° C. | 184° C. | 73.7% Pb/25% Sn/1.3% Sb |
| 266° C. | 266° C. | 82.6% Cd/17.4% Zn |
| 268° C. | 183° C. | 75% Pb/25% Sn |
| 270° C. | 184° C. | 79% Pb/20% In/1% Sb |
| 271° C. | 271° C. | 100% Bi |
| 275° C. | 260° C. | 81% Pb/19% In |
| 280° C. | 183° C. | 80% Pb/20% Sn |
| 280° C. | 280° C. | 80% Au/20% Sn |
| 285° C. | 239° C. | 92% Pb/5% Sn/3% Sb |
| 288° C. | 183° C. | 85% Pb/15% Sn |
| 289° C. | 179° C. | 57% Pb/40% Sn/3% Ag |
| 290° C. | 267° C. | 88% Pb/10% Sn/2% Ag |
| 292° C. | 292° C. | 90% Pb/5% Ag/5% Sn |
| 295° C. | 221° C. | 90% Sn/10% Ag |
| 295° C. | 252° C. | 95% Pb/5% Sb |
| 296° C. | 287° C. | 92.5% Pb/5% Sn/2.5% Ag |
| 300° C. | 227° C. | 97% Sn/3% Cu |
| 302° C. | 275° C. | 90% Pb/10% Sn |
| 302° C. | 275° C. | 89.5% Pb/10.5% Sn |
| 303° C. | 303° C. | 97.5% Pb/2.5% Ag |
| 304° C. | 299° C. | 95.5% Pb/2.5% Ag/2% Sn |
| 304° C. | 304° C. | 93% Pb/3% Sn/2% In/2% Ag |
| 309° C. | 309° C. | 97.5% Pb/1.5% Ag/1% Sn |
| 310° C. | 290° C. | 90% Pb/5% In/5% Ag |
| 310° C. | 300° C. | 92.5% Pb/5% In/2.5% Ag |
| 312° C. | 308° C. | 95% Pb/5% Sn |
| 313° C. | 300° C. | 95% Pb/5% In |
| 313° C. | 313° C. | 91% Pb/4% Sn/4% Ag/1% In |
| 315° C. | 315° C. | 98% Pb/1.2% Sb/0.8% Ga |
| 320° C. | 300° C. | 98% Pb/2% Sb |
| 322° C. | 310° C. | 98.5% Pb/1.5% Sb |
| 327° C. | 327° C. | 100% Pb |
| 330° C. | 231° C. | 98% Sn/2% As |
| 345° C. | 232° C. | 99% Sn/1% Ge |
| 356° C. | 356° C. | 88% Au/12% Ge |
| 363° C. | 363° C. | 96.8% Au/3.2% Si |
| 364° C. | 305° C. | 95% Pb/5% Ag |
| 365° C. | 304° C. | 94.5% Pb/5.5% Ag |
| 382° C. | 382° C. | 95% Zn/5% Al |
| 395° C. | 340° C. | 95% Cd/5% Ag |
| 424° C. | 424° C. | 55% Ge/45% Al |
| 465° C. | 451° C. | 75% Au/25% In |
| 485° C. | 451° C. | 82% Au/18% In |
| 525° C. | 525° C. | 45% Ag/38% Au/17% Ge |
| 577° C. | 577° C. | 88.3% Al/11.7% Si |
| 585° C. | 521° C. | 86% Al/10% Si/4% Cu |
| 610° C. | 577° C. | 92.5% Al/7.5% Si |
| 620° C. | 605° C. | 45% Ag/24% Cd/16% Zn/15% Cu |
| 630° C. | 577° C. | 95% Al/5% Si |
| 635° C. | 625° C. | 50% Ag/18% Cd/16.5% Zn/15.5% Cu |
| 650° C. | 620° C. | 56% Ag/22% Cu/17% Zn/5% Sn |
| 660° C. | 660° C | 100% Al |
| 690° C. | 630° C. | 50% Ag/16% Cd/15.5% Cu/15.5% Zn/3% Ni |
| 700° C. | 605° C. | 35% Ag/26% Cu/21% Zn/18% Cd |
| 705° C. | 603° C. | 61% Ag/24% Cu/15% In |
| 705° C. | 640° C. | 80% Cu/15% Ag/5% P |
| 710° C. | 605° C. | 30% Ag/27% Cu/23% Zn/20% Cd |
| 720° C. | 600° C. | 60% Ag/30% Cu/10% Sn |
| 780° C. | 780° C. | 72% Ag/28% Cu |
| 785° C. | 775° C. | 71.5% Ag/28% Cu/0.5% Ni |
| 800° C. | 370° C. | 98% Au/2% Si |
| 800° C. | 690° C. | 63% Ag/28.5% Cu/6% Sn/2.5% Ni |
| 890° C. | 890° C. | 80% Au/20% Cu |
| 961° C. | 961° C. | 100% Ag |
| 985° C. | 665° C. | 85% Cu/8% Sn/7% Ag |
| 1020° C. | 1000° C. | 50% Au/50% Ag |
| 1030° C. | 360° C. | 99.4% Au/0.6% Sb |
| 1030° C. | 1025° C. | 99% Au/1% Ga |
| 1063° C. | 1063° C. | 99.8% Au/0.2% P |
| 1064° C. | 1064° C. | 100% Au |

Thus, for example, a binary binding metal of 96.8% Au/3.2% Si melts around 363° C. Using a barrier metal to trap, alloy with or take up as much Si as possible elevates the melting temperature of the new binding metal closer to that of 100% Au (i.e. closer to its melting point of 1064° C.). The same is true for a ternary compound such as BiPbSn. For example, a binding metal of 50% Bi/25% Pb/12.5% Sn has a melting temperature of 73° C. Using a barrier that will trap, alloy with or take up the Bi can result in a new binding metal of, for example, 65% Pb/35% Sn or 70% Pb/30% Sn with a melting temperature of about 247° C. to 257° C. depending upon the specific concentrations of the Pb and Sn.

Thus, generically, the barrier and bonding material will be selected such that, upon heating to about or above the melting temperature of the bonding metal, a component (or components) of the bonding metal that would affect the melting temperature will either: i) leave the bonding metal and join in some way with the barrier if the presence in the bonding metal reduces the melting point of the bonding metal, or ii) add to the bonding metal if the addition of that component (or those components) to the bonding metal if the presence in the bonding metal increases the melting point of the bonding metal.

Figure 6:
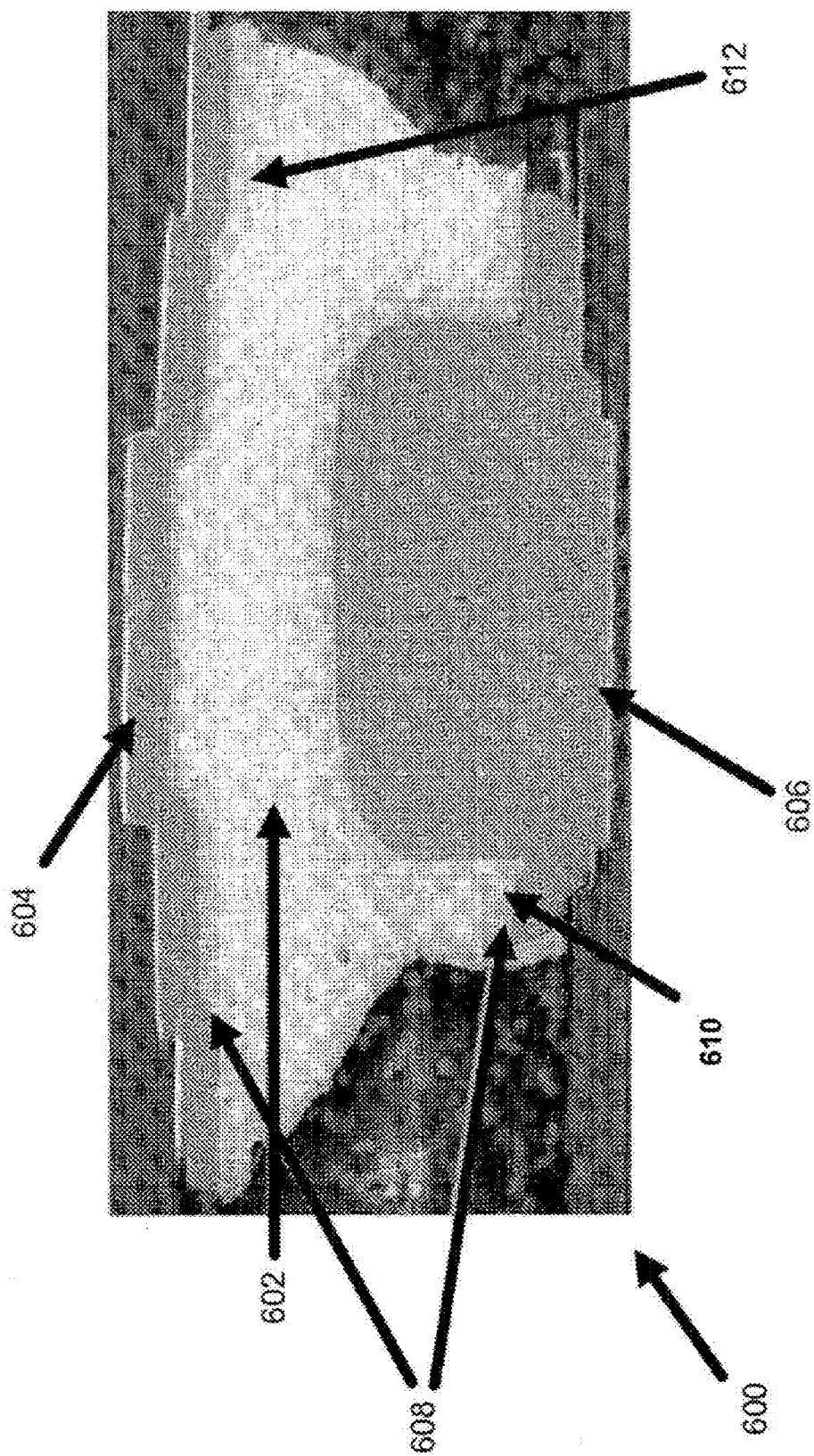
FIG. 6 is a photograph of a cross section of a rigid and malleable contacts after a fuse process has been completed.

FIG. 4 through FIG. 6 are photographs of cross-sections of an example of the above approach. As shown in FIG. 4 through FIG. 6, the approach involves a post and penetration connection in conjunction with a tack and fuse process.

FIG. 4 is a photograph of a cross section of an example malleable contact 400. In the photograph, the bonding metal 402 is a malleable material made up of a layer of pure gold (100% Au) 404 capped by a layer of tin (100% Sn) 406. A barrier of nickel (100% Ni) 408 sits between the gold 404 and the chip contact pad 410.

With the post and penetration approach, a mating rigid contact is made up of a post on top of the chip contact pad. With this approach, optionally, the post is covered by a barrier. The two contacts are brought together under suitable pressure and, if necessary, at an elevated temperature. The rigid post penetrates the cap of tin and enters the malleable material on the mating contact. Thereafter, if for example, a tack and fuse approach is also used, the contact is optionally subjected to a tack cycle. An example result of this approach is shown in FIG. 5.

FIG. 5 is a photograph of a cross section 500 of the joined post 502 of the rigid contact and the malleable contact 400 after the tack cycle process has been completed. As can be seen, a substantial amount of pure gold (100% Au) 404 remains near the barrier of the malleable contact, however, the tin and gold layers have formed a gold-tin alloy 504 in the volume between the pure gold 404 and the post 502. As shown, the gold-tin alloy 504 is approximately 80% gold and 20% tin.

At some point later, the contact undergoes a fuse process. During the fuse process, the gold and tin mix together to form a relatively uniform gold-tin alloy and some of the tin is attracted to, and thus migrates to, the nickel barrier on the malleable contact or on the post and binds with the nickel barriers.

FIG. 6 is a photograph of a cross section 600 of a rigid and malleable contact, like that of FIG. 5, after a fuse phase of the tack and fuse process has been completed. As a result of the fuse phase, the final result is a substantially uniform volume 602 of pure gold (about 98% Au) connection between the two contact pads 604, 606. In addition, an alloy 608 has formed at the barrier interfaces 610, 612 of the two contacts that is approximately 45% Au/35% Sn/20% Ni. Formation of this alloy 608 uses the free tin atoms and thereby creates a nickel-trapped, high-tin content region near the barrier while, as noted above, the tin concentration at the center between the two contacts is very low (about 2%) because the bulk of the tin has been absorbed and trapped by the nickel in forming the alloy 608.

Advantageously, once the barrier has trapped the material that would otherwise migrate through formation of the alloy 608, elevated temperatures and the passage of time results in little to no phase segregation because the amount of mobile material is extremely small.

Figure 7:
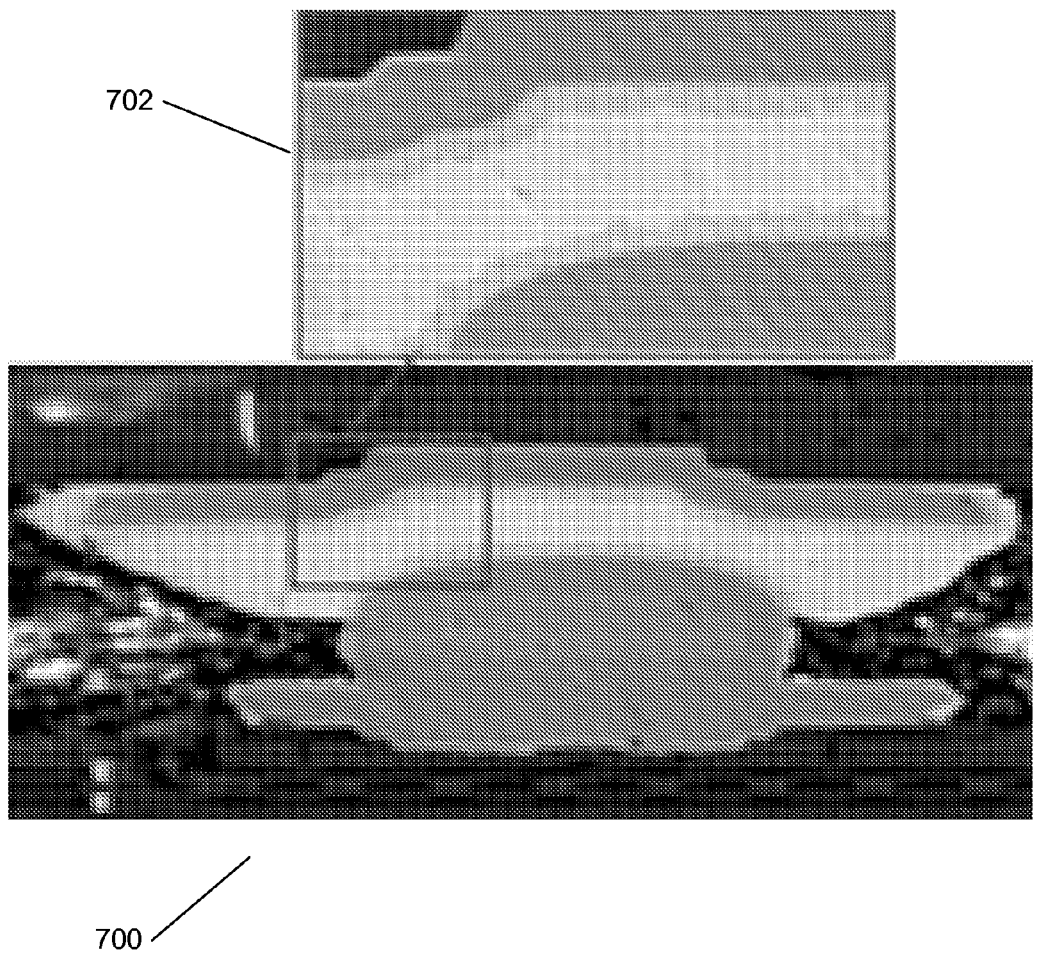
FIG. 7 is a photograph of a cross section of a rigid and malleable contact, similar to that of FIG. 6, of a chip after a fuse process has been completed.

FIG. 7 is a photograph of a cross section 700 of a rigid and malleable contact, similar to that of FIG. 6, of a chip after a fuse process has been completed. An enlarged view of a section 702 of the connection shows no phase segregation.

Figure 8:
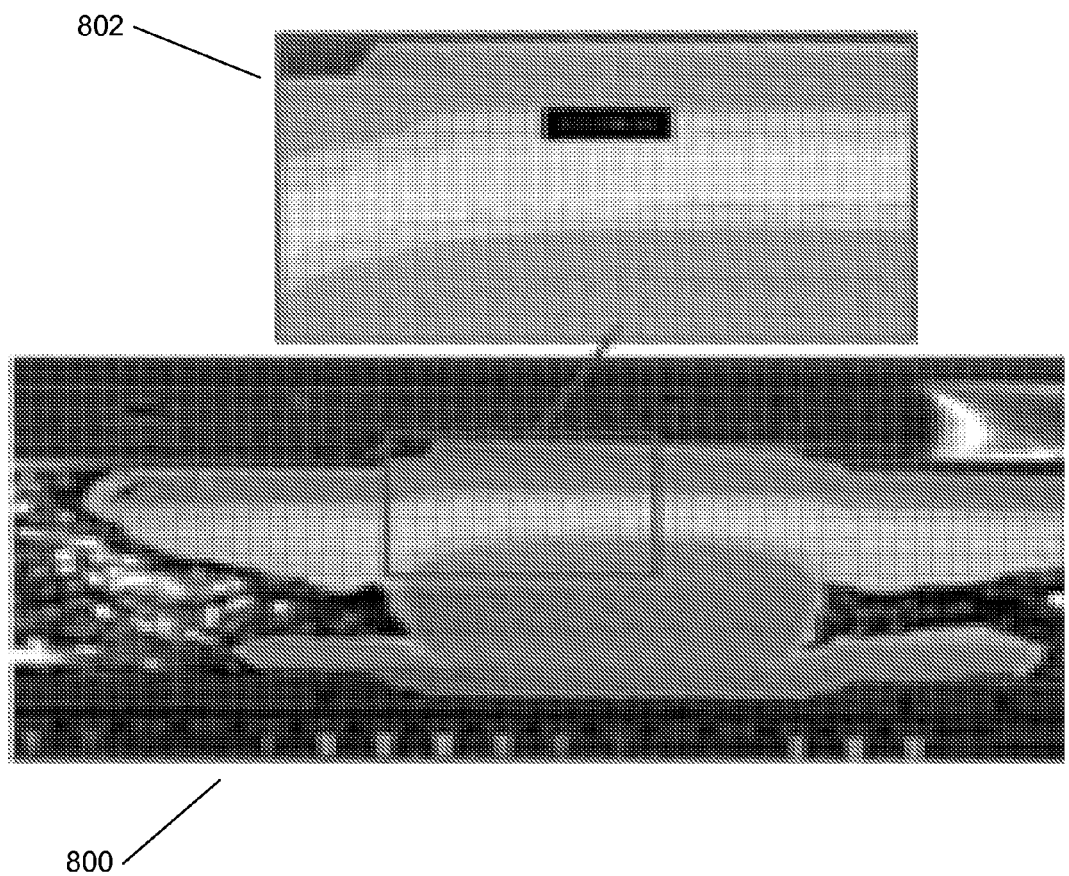
FIG. 8 depicts a cross section of a rigid and malleable contact after 1000 hours at 200° C., in accordance with an illustrative embodiment.

FIG. 8 is a photograph of a cross section 800 of a similar rigid and malleable contact from the same chip after spending 1000 hours at 200° C., a section 802 of which is shown further enlarged. As can be seen by comparing the two sections 702, 802 of the photographs, it is clear that neither the elevated temperature nor the passage of time has resulted in any visible phase segregation. To avoid any misunderstanding or confusion, the black rectangle in FIG. 8 is due to a measurement box superimposed on the image and is not present on the cross section itself. Plainly, the contact 800 of FIG. 8 is essentially unchanged from what it would have looked like immediately following completion of the fuse cycle of the tack and fuse process.

It is important to note that, although the above was generally described with reference to discrete "layers" of gold and tin, it should be understood that the same approach can be used with alloys or solders instead of pure materials as the bonding metal and/or barrier material, the important aspect being that the barrier material is selected such that it will absorb, bind with or trap the atoms that would otherwise migrate, clump or create voids through phase segregation or electromigration or can increase or add a concentration of a high melting point material to the bonding metal.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of forming an electrical connection, the method comprising joining a first electrical contact and a second electrical contact using a bonding material and a barrier material, wherein the bonding material comprises an alloy having a first composition that includes a first component and a second component, wherein the barrier material has a selected concentration such that the barrier material binds mobile portions of the first component or the second component, thereby changing the first composition to a second composition that includes the first and second components, and wherein the second composition has a higher melting temperature than the first composition.

2. The method of claim 1, wherein the barrier material has a volume that is at least 20% of the combined volume of the barrier material and the diffusive mobile component.

3. The method of claim 1, wherein the first and second electrical contacts, the bonding material, and the barrier material include a rigid portion and a malleable portion, and wherein said joining comprises penetrating the rigid portion into the malleable portion.

4. The method of claim 1, wherein the height of the bonding material is limited to less than 25 μm.

5. The method of claim 1, wherein the height of the bonding material is limited to less than 15 μm.

6. The method of claim 1, wherein the height of the bonding material is limited to less than 9 μm.

7. The method of claim 1, wherein the barrier material has a volume that is between 20% and 67% of the combined volume of the barrier material and the diffusive mobile component.

8. The method of claim 1, wherein the barrier material binds a substantial portion of the diffusive mobile component such that the electrical connection will last at least 1000 hours without substantial phase migration.

9. An electrical connection between two contacts, the electrical connection comprising:
  a bonding material including an alloy having a first composition comprising a first component and a second component; and
  a barrier material configured to bind mobile portions of the first component or the second component, thereby changing the first composition to a second composition of the first and second components, wherein the second composition has a higher melting point than the first composition;
  wherein the barrier material has a volume that is at least 20% of the combined volume of the barrier material and the mobile material such that the barrier material binds a substantial portion of the mobile material; and
  wherein at least a portion of the mobile material has been part of at least one of the two contacts, a bonding metal prior to forming the electrical connection, or a barrier over the bonding metal.

10. The electrical connection of claim 9, wherein the bonding metal comprises gold.

11. The electrical connection of claim 9, wherein the barrier material comprises at least one of nickel (Ni), chromium (Cr), titanium (Ti), platinum (Pt), palladium (Pd), tantalum (Ta), or tungsten (W).

12. The electrical connection of claim 9, wherein the mobile material comprises tin.

13. An apparatus comprising a connection between two electrical contacts, wherein the connection includes a bonding metal having a first composition and a first melting point, a barrier material, and an alloy, wherein the alloy has a mobile constituent component capable of phase segregation over time prior to forming the connection, and wherein the barrier material binds a substantial portion of the mobile constituent component such that:
  the connection is capable of lasting at least 1000 hours at a temperature of 200° C. without undergoing substantial phase segregation; and
  the first composition of the bonding metal is changed to a second composition of bonding metal having a second melting point that is higher than the first melting point.

14. The apparatus of claim 13, wherein the alloy further comprises:
  at least some barrier material; and
  at least some bonding metal.

15. A method of forming an electrical connection between a pair of electrical connection points, the method comprising:
  heating a first bonding metal having a first concentration of constituent components to at least about a melting point of the first bonding metal, wherein the first bonding metal comprises a diffusive mobile component;
  providing, in proximity to the first bonding metal, a material that can interact with the first bonding metal to change the first concentration of constituent components into a second concentration of constituent components when said heating a first bonding metal occurs such that the first bonding metal will change into a second bonding metal, wherein the material that can interact with the first bonding metal comprises a barrier material configured to bind a substantial portion of the diffusive mobile component during said heating, and wherein the second bonding metal has a melting point that is higher than the melting point of the first bonding metal; and
  cooling the pair of electrical connection points and the second bonding metal to below the melting point of the first bonding metal.

16. The method of claim 15, further comprising, following said cooling, reheating the pair of electrical connection points and the second bonding metal to a reheat temperature that is equal to or greater than the melting point of the first bonding metal, but less than the melting point of the second bonding metal.

17. The method of claim 16, further comprising repeating said reheating multiple times in a chip-stacking process.

18. The method of claim 15, wherein the barrier material has a volume that is at least 20% of the combined volume of the barrier material and the diffusive mobile component.

19. The method of claim 15, wherein the first bonding metal and the pair of electrical connection points include a rigid portion and a malleable portion, the method further comprising penetrating the rigid portion into the malleable portion.

* * * * *